United States Patent
Ito et al.

[19]

[11] Patent Number: 5,969,341
[45] Date of Patent: Oct. 19, 1999

[54] OPTICAL INTEGRATED VOLTAGE SENSOR FOR OPTICALLY MEASURING THE MAGNITUDE OF A VOLTAGE

[75] Inventors: Hiroshi Ito, Kasugai; Tadashi Ichikawa, Nagoya; Satoru Kato, Nisshin, all of Japan

[73] Assignee: Kabushiki Kaisha Toyota Chuo Kenkyusho, Aichi-ken, Japan

[21] Appl. No.: 08/949,006

[22] Filed: Oct. 10, 1997

[30] Foreign Application Priority Data

Oct. 11, 1996 [JP] Japan .................................. 8-289304

[51] Int. Cl.$^6$ ...................................................... G02B 5/14
[52] U.S. Cl. .............................. 250/227.11; 250/227.27; 356/352; 324/96
[58] Field of Search ........................ 250/227.14, 227.19, 250/227.27, 227.11; 356/351–354; 324/96

[56] References Cited

U.S. PATENT DOCUMENTS

| 4,533,829 | 8/1985 | Miceli et al. ....................... 250/227.27 |
| 5,210,407 | 5/1993 | Ito et al. ............................. 250/227.11 |
| 5,278,499 | 1/1994 | Ito et al. . |

FOREIGN PATENT DOCUMENTS

| 59-166873 | 9/1984 | Japan . |
| 63-10465 | 1/1988 | Japan . |
| 2-184772 | 7/1990 | Japan . |

*Primary Examiner*—Stephone Allen
*Attorney, Agent, or Firm*—Oblon, Spivak, McClelland, Maier & Neustadt, P.C.

[57] ABSTRACT

A compact voltage sensor with stable characteristics is provided. A measuring beam that is incident from an optical fiber is branched into first and second modulation-inducing waveguides of a wave branching/combining section within an optical integrated circuit. Phase changes of opposite sign are induced in the measuring beams propagating within the first and second modulation waveguides by applying voltages of mutually opposite sign to modulation-inducing electrodes, to induce a phase difference between the two. By reflecting the measuring beams from a reflective surface, propagating them back in the opposite direction within the first and second modulation waveguides, and passing them through the optical intensity modulation section again, thus applying a further phase modulation thereto, the phase difference between the measuring beams proceeding in the opposite direction within the first and second modulation waveguides can be made to be substantially twice the phase difference of the measuring beams before they are reflected by the reflective surface. The sensor also has a function to protect a sensor section thereof from dielectric breakdown caused by the accidental input of a high voltage.

13 Claims, 6 Drawing Sheets

OPTICAL INTEGRATED VOLTAGE SENSOR FOR OPTICALLY MEASURING THE MAGNITUDE OF A VOLTAGE

BACKGROUND OF THE INVENTION

1. Field of the Invention

This invention relates to an optical integrated voltage sensor for measuring the magnitude of a voltage in an optical manner.

2. Description of the Prior Art

In today's highly information-orientated world, the importance of electromagnetic waves as a medium for propagating information for broadcasting and communications is growing, and both the intensity and frequency of these waves are tending to increase.

At the same time, the problem of functional malfunctions in electronic equipment, caused by these electromagnetic waves, is also increasing. There is a danger that such functional malfunctions in equipment could cause a great deal of damage, particularly in the fields of medical equipment which is indispensable for maintaining human life, office equipment which processes large quantities of information at speed, and automobile electronics. That is why measures to counteract malfunctions due to electromagnetic waves have become an extremely important topic of technical concern.

When it comes to evaluating the resistance of electronic equipment to malfunctions due to electromagnetic waves, or when countermeasures are necessary after a functional error has occurred as the result of a malfunction due to electromagnetic waves, it is necessary to place the electronic equipment in an electromagnetic environment that re-creates that state, measure the voltage signal waveforms that are output from the circuitry within the electronic equipment, and thus determine the source of abnormal signals. An oscilloscope is well-known as means of monitoring such voltage signal waveforms.

However, cables that are metal conductors are used in this method for transferring the output signals from measurement locations within the circuitry to the input terminals of the oscilloscope. This means that noise is induced by electromagnetic fields within this metal cable, making accurate measurement impossible.

In order to solve these problems, voltage sensors that are being developed use optical integrated circuits formed on a substrate of an electro-optical crystal, such as LiNbO3, within the voltage detector sections thereof.

An example of such a voltage sensor is shown in FIG. 2.

This sensor comprises a light source 10, a light detector 12, and a sensor section 21 configured of an optical integrated circuit 32 that functions as a waveguide type of branching interferometer optical modulator. These components are connected together optically by an optical fiber 11 for inputting a measuring beam and another optical fiber 13 for outputting the measuring beam. The optical integrated circuit 32 has a waveguide 17 for propagating the measuring beam that is incident thereto through the optical fiber 11. This waveguide 17 is configured to branch into first and second modulation-inducing waveguides 15a and 15b at a branch section 23, then combine these waveguides once again at a wave-combining section 25.

Modulation-inducing electrodes 34a and 34b are formed on the first and second modulation-inducing waveguides 15a and 15b. When fine metal wires 27a and 27b that extend therefrom are brought into contact with an object 18 whose voltage is to be measured, which acts as a voltage measurement section within an electrical circuit, the voltage of the object 18 whose voltage is to be measured is applied to the first and second modulation-inducing waveguides 15a and 15b as voltage signals of opposite signs, through the modulation-inducing electrodes 34a and 34b.

When a measuring beam from the light source 10 is input towards the sensor section 21 through the optical fiber 11, this measuring beam is propagated into the optical modulation section through the waveguide 17 in the optical integrated circuit 32.

As described previously, voltage signals of opposite signs are applied to the modulation-inducing electrodes 34a and 34b in the first and second modulation-inducing waveguides 15a and 15b, so that a phase difference is generated in the light waves travelling within the waveguides 15a and 15b. Therefore, constructive interference at the wave-combining section 25 between the light waves passing through the two waveguides 15a and 15b causes the intensity of the light to be modulated by the phase difference, then this light is input to the light detector 12 through the optical fiber 13.

In this particular case, the voltage required for varying the luminous energy from a maximum to a minimum, which is called the half-wavelength voltage, is no more than a few volts. Thus, since a large change in luminous energy is achieved even when a small voltage is applied, the measurement sensitivity of this sensor is extremely high.

It is therefore possible for this signal processing section 20 to obtain the phase difference from the intensity of the modulated measuring beam, and thus the magnitude of the voltage, by using the light detector 12 to measure the intensity of the modulated measuring beam that is output from the optical integrated circuit 32 and inputting the result to the signal processing section 20.

A particular characteristic of this type of device is the way in which components such as the sensor section 21 and the optical fibers 11 and 13 are mainly formed by using dielectric materials. This makes it possible to measure voltages accurately and with a high degree of sensitivity, without any effects due to electromagnetic fields.

However, two optical fibers 11 and 13 are connected to this device, for inputting a measuring beam to the optical integrated circuit 32 and outputting it therefrom, as described above. It is therefore impossible to make the sensor section 21 compact enough for practicable use, raising the problem that it is difficult to measure voltages in cramped locations.

In other words, it is desirable to design the sensor section used in such a device to have a cantilevered structure, so that one of the two optical fibers 11 and 13 shown in FIG. 2 must be curved and connected to the sensor section. However, optical fibers cannot be said to be very flexible, so their minimum radius of curvature is on the order of several cm. This raises a problem when forming a cantilevered-structure sensor in that it is difficult to make it compact enough to meet the practicability requirements of a size of no more than 20 to 30 mm.

Furthermore, a connection portion between an optical fiber and a waveguide requires the most precise adjustment and is subject to mechanical slippage due to factors such as temperature or vibration, and thus changes in the characteristics thereof can easily occur. Since the sensor shown in FIG. 2 requires two optical fibers, it has to have two such connections. Making these connections is an extremely awkward task and this has prevented the inexpensive fabrication of a device that can operate stably.

This device has a further problem in that, if the voltage applied to the modulation-inducing electrodes should exceed the dielectric breakdown voltage of the optical integrated circuit substrate and modulation-inducing electrodes, even accidentally, the optical integrated circuit substrate and modulation-inducing electrodes could be damaged by dielectric breakdown, making the device unusable.

SUMMARY OF THE INVENTION

The present invention was devised in order to solve the above described problems in the art. The objective thereof is to provide an optical integrated voltage sensor that is compact and has stable characteristics, and which is also provided with sensor means that functions to protect a sensor section thereof from dielectric breakdown caused by the input of high voltages.

In order to achieve the above objective, the optical integrated voltage sensor of this invention comprises:

measuring beam generation means for outputting a measuring beam;

an optical fiber for guiding the measuring beam;

sensor means for modulating the intensity of the measuring beam in accordance with a measurement voltage and outputting the modulated measuring beam back towards the optical fiber;

branching means provided between the measuring beam generation means and the optical fiber, for passing the measuring beam from the measuring beam generation means and branching the measuring beam modulated by the sensor means into a given direction; and signal processing means for calculating the measurement voltage, based on the intensity of the measuring beam branched by the branching means;

wherein the sensor means comprises an optical integrated circuit, which comprises:

a waveguide formed at one end as a measuring beam incident section and at the other end as a measuring beam reflection section; and an optical intensity modulation section for modulating and outputting the intensity of the measuring beam propagating within the waveguide in accordance with the measurement voltage.

In this aspect of the invention, the optical fiber is preferably set to be long enough to enable an optical connection between the measuring beam generation means and a sensor means that is used in the vicinity of the object whose voltage is to be measured.

The optical integrated voltage sensor of this aspect of the invention enables the sensor means to have a cantilevered structure that does not require bending of the optical fiber, and which also makes it possible for the measuring beam to pass twice through the optical intensity modulation section so that the optical intensity is modulated twice. This makes the sensor means even more compact so that it can measure voltages to a high degree of sensitivity in cramped locations.

The waveguide may comprise a first modulation-inducing waveguide and a second modulation-inducing waveguide which are branched off at a wave branching/combining section. The measuring beam reflection section may be formed at the other end of each of the first and second modulation-inducing waveguides. The optical intensity modulation section may be provided with a pair of electrodes for applying oppositely polarized voltages to the first and second modulation-inducing waveguides, thereby modifying the phases of the measuring beams propagating within each of the modulation-inducing waveguides, and causing constructive interference between the modified measuring beams at the wave branching/combining section so as to output a measuring beam of an intensity that has been modified in accordance with the measurement voltage.

The optical integrated voltage sensor of this aspect of the invention has only one connection between the sensor means, the waveguide, and the optical fiber, enabling it to measure voltages stably over long periods of time.

In other words, this connecting section between the optical fiber and the waveguide is the component that necessitates the most precise adjustment, and it is also liable to cause changes in the characteristics because of long-term mechanical slippage. This invention makes it possible to use a single optical fiber for both inputting and outputting the measuring beam, not two optical fibers as in the prior art. There is therefore only one connecting portion between this optical fiber and the waveguide, which enables the inexpensive fabrication of an optical integrated voltage sensor that can measure voltages stably and highly accurately for a long time.

The optical intensity modulation section may be provided with a voltage-divider circuit for dividing the voltage of a signal, and a voltage that corresponds to a voltage-division ratio thereof may be applied to the electrodes.

In the optical integrated voltage sensor of this aspect of the invention, a voltage that has been divided by the voltage-divider circuit is applied to the pair of electrodes. This means that there is less danger of dielectric breakdown occurring, even if a high voltage is carelessly applied to the sensor means, thus making it possible to obtain an optical integrated voltage sensor that is less likely to become damaged.

The voltage-divider circuit may comprise:

a first resistor provided between the electrodes;

a second resistor connected in series with the first resistor; and a first capacitor obtained from the structure of the optical integrated circuit, being connected in parallel with the ends of the first resistor;

wherein a signal voltage may be applied to the series circuit of the first and second resistors and a divided voltage may be output from the electrodes connected to the first resistor.

The optical integrated voltage sensor of this aspect of the invention makes it possible to construct the voltage-divider circuit in a simple manner.

The voltage-divider circuit may further comprise a second capacitor that is connected in parallel with the second resistor.

This second capacitor may be set to have a capacitance that compensates for the frequency dependency of the voltage-divider circuit caused by the first capacitor.

The optical integrated voltage sensor of this aspect of the invention makes it possible to use the second capacitor to compensate for the effects of frequency, so that a favorable divided output can be achieved even if a high-frequency voltage is applied to the optical integrated voltage sensor.

The product of the capacitance of the first capacitor and the resistance of the first resistor may be substantially equal to the product of the capacitance of the second capacitor and the resistance of the second resistor.

This ensures that the optical integrated voltage sensor of this aspect of the invention can measure voltages over a wide range of frequencies, even when the above voltage-divider circuit is used in the optical integrated voltage sensor.

The optical integrated voltage sensor may further comprise a voltage-measurement terminal section which is provided on a far end surface side of the optical integrated circuit, for contacting a voltage measurement section of an object to be measured and supplying the measurement voltage to the electrodes.

This optical integrated voltage sensor may further comprise a voltage-measurement terminal section which is provided on a far end surface side of the optical integrated circuit, for contacting a voltage measurement section of an object to be measured and supplying the measurement voltage to the voltage-divider circuit;

wherein the voltage-divider circuit may divide a voltage from the terminal section and apply the divided voltage to the electrodes.

Since the optical integrated voltage sensor of this aspect of the invention is compact and has a cantilevered structure, the freed space at the other end of the optical integrated circuit can be utilized to provide voltage-measurement terminals. This makes it possible to create an optical integrated voltage sensor that is even more useful.

The sensor means may comprise a housing which fixes the optical fiber to one end side thereof and the terminal section to another end side thereof.

The terminal section may be fixed into the housing and comprise a contact probe in contact with a voltage measurement section of the object to be measured.

The terminal section may comprise:

a contact probe fixed to the housing and having an end that contacts a first voltage measurement section of the object to be measured; and gripper means for gripping a second voltage measurement section of the object to be measured, in such a manner as to maintain an electrical contact state;

wherein a voltage between the first and second voltage measurement sections of the object to be measured may be supplied to the voltage-divider circuit.

The terminal section may be fixed into the housing and comprise a contact probe in contact with a voltage measurement section of the object to be measured, thereby supplying voltage of the voltage measurement section against ground to the voltage-divider circuit.

Furthermore, the terminal section may comprise:

a first gripper means for gripping a first voltage measurement section of the object to be measured in such a manner as to maintain an electrical contact state; and a second gripper means for gripping a second voltage measurement section of the object to be measured in such a manner as to maintain an electrical contact state;

wherein a voltage between the first and second voltage measurement sections of the object to be measured may be supplied to the voltage-divider circuit.

DESCRIPTION OF PREFERRED EMBODIMENTS

Embodiments of this invention will be described below, with reference to the accompanying drawings.

Figure 1:
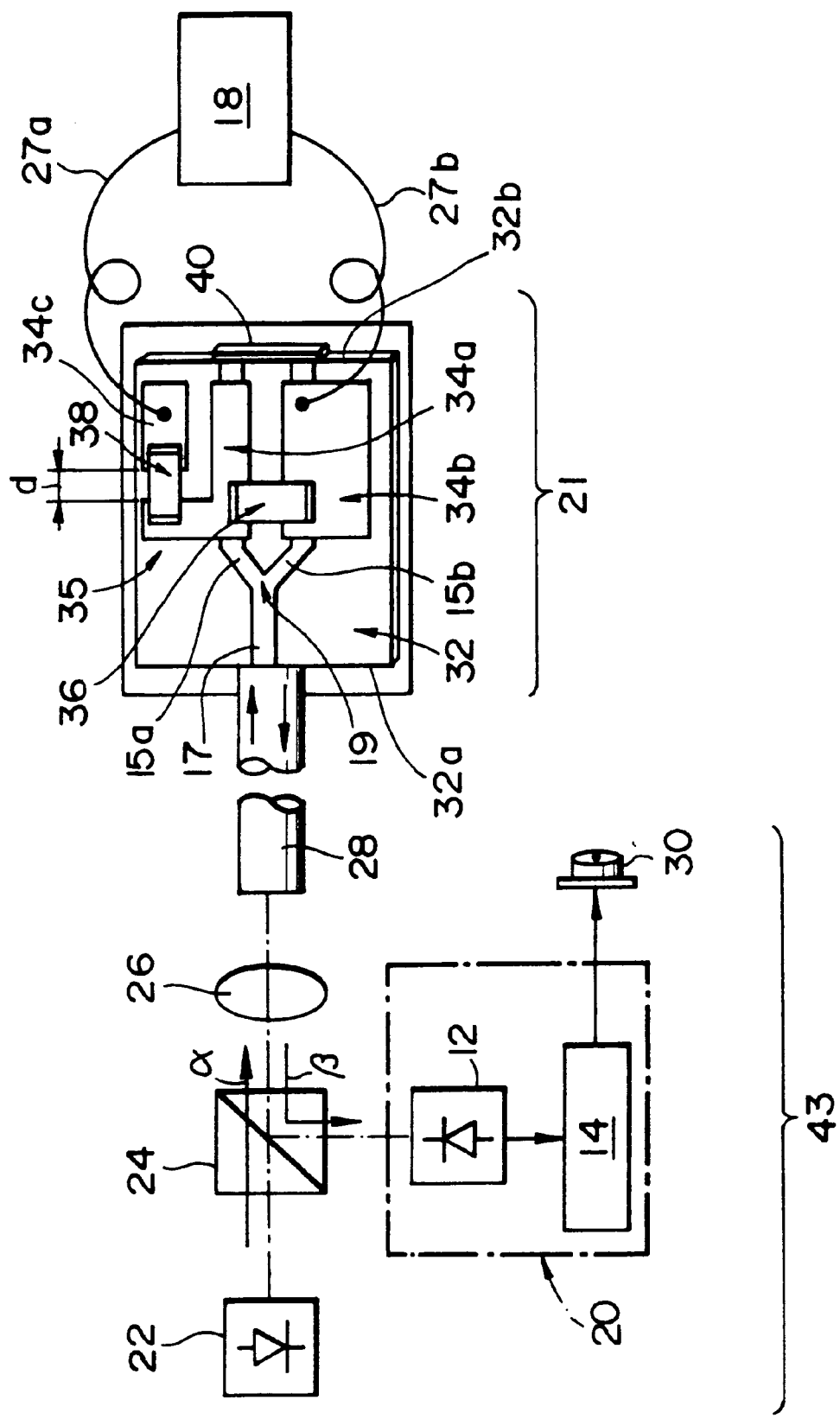
FIG. 1 shows the optical integrated voltage sensor of an embodiment of this invention.
Figure 2:
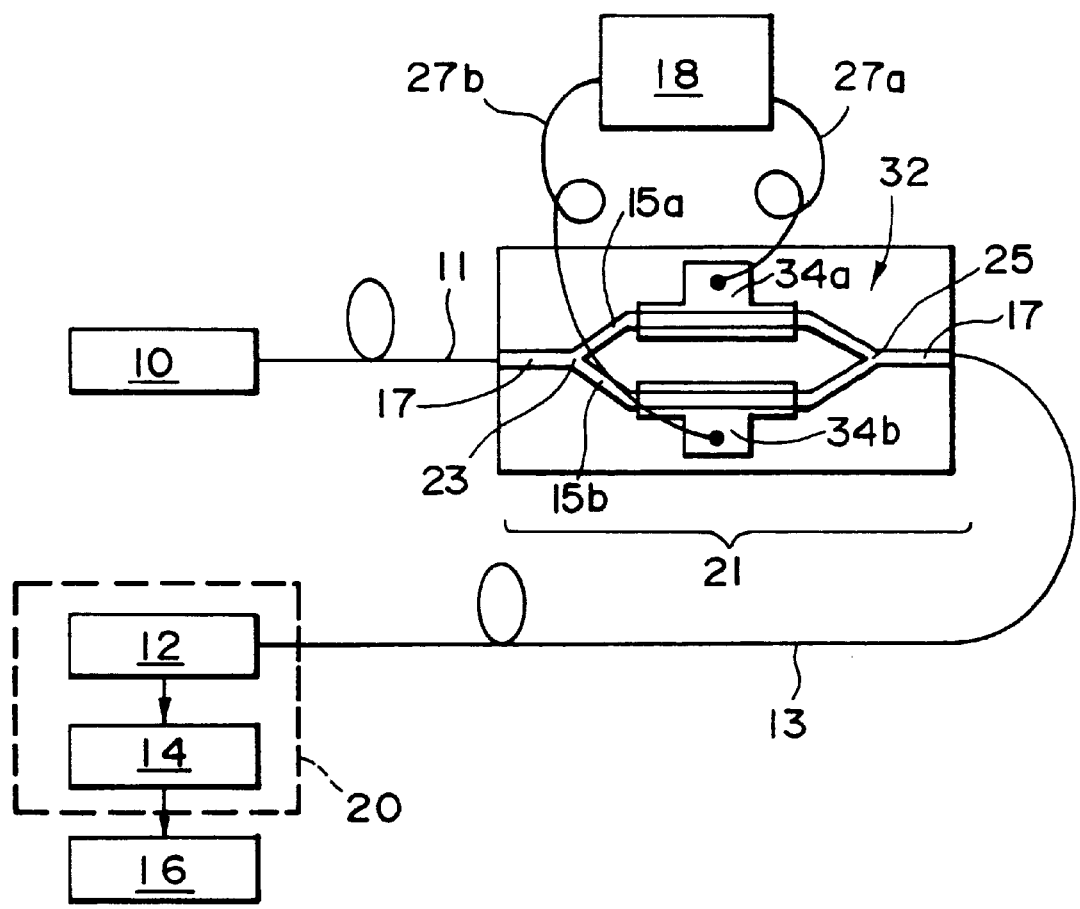
FIG. 2 shows the optical integrated voltage sensor on which the development of this invention was based.

A conceptual view of an optical integrated voltage sensor in accordance with this invention is shown in FIG. 1. The configuration of this optical integrated voltage sensor is described below.

The optical integrated voltage sensor of this embodiment comprises a sensor section 21, a measuring beam generation section 22, and a signal processing section 20.

The measuring beam generation section 22 and the sensor section 21 are connected optically by an optical system that includes a beam splitter 24, a lens 26, and an optical fiber 28.

This measuring beam generation section 22 is designed to output a measuring beam and comprises a light source (not shown in the figure) and an optical system (not shown in the figure) that forms the output light thereof into a parallel beam for output to the beam splitter 24.

Any source of light can be used as this light source, such as a laser, a light-emitting diode, or a super-luminescent diode, but a laser is used in this embodiment because it can be combined with an optical fiber.

Any type of laser can be used therefor, such as an HeNe laser, a YAG laser, or a semiconductor laser, but a semiconductor laser is used in this embodiment because it is compact.

The beam splitter 24 is formed in such a manner that the measuring beam that is input thereto from the measuring beam generation section 22 is divided into two parts and output in a transmitted direction and a reflected direction perpendicular thereto. In other words, the measuring beam that is output by the measuring beam generation section 22 of this embodiment is divided into two parts, in a direction $\alpha$ that passes through the beam splitter 24 of FIG. 1 and a reflected direction that is perpendicular thereto, and only the part of the measuring beam that passes through the beam splitter 24 is output towards the optical fiber 28. A measuring beam that returns from the sensor section 21 through the optical fiber 28 is divided into two parts, in a direction that passes from the sensor section 21 through the beam splitter 24 and a reflected direction $\beta$ that is perpendicular thereto, and only the measuring beam that is reflected in the perpendicular direction is output towards the signal processing section 20.

The measuring beam that has passed through the thus-configured beam splitter 24 is focussed by the lens 26 and is shone onto the optical fiber 28. Any of various different types of optical fiber could be used as the optical fiber 28, as necessary, but an optical fiber with a maintained plane of polarization is used in this embodiment. The measuring beam that is incident on this optical fiber 28 is propagated towards the sensor section 21.

The sensor section 21 is designed in such a manner that, when the measuring beam from the optical fiber 28 is incident thereon, it modulates the measuring beam in accordance with the magnitude of a voltage and outputs the modulated measuring beam back towards the optical fiber 28.

More specifically, this sensor section 21 comprises an optical integrated circuit 32, which is provided with an optical intensity modulation section that enables an external voltage to vary the intensity of the measuring beam, and a voltage-divider circuit 35 for dividing the external voltage and applying the two parts to modulation-inducing electrodes 34a and 34b.

Within this optical integrated circuit 32 is formed a waveguide 17 into which is incident the measuring beam that is propagated through the optical fiber 28. This waveguide 17 is configured to branch into a first modulation-inducing waveguide 15a and a second modulation-inducing waveguide 15b at a wave branching/combining section 19.

Various different methods could be used as necessary for a waveguide type of optical intensity modulation section that is formed as an optical integrated circuit, such as a branching interferometer type, a directional coupling type, a crossed type, or the like. This embodiment uses a method of using a branching interferometer to cause a certain amount of deformation.

The voltage-divider circuit 35 comprises two voltage-dividing resistors 36 and 38 and three electrodes 34a, 34b, and 34c. One voltage-dividing resistor 36 is connected between the electrodes 34a and 34b and the other voltage-dividing resistor 38 is connected between the electrodes 34a and 34c.

One end of each of two fine metal wires 27a and 27b is connected to each of the electrodes 34b and 34c of the voltage-divider circuit 35. A voltage Ein of an object to be measured 18 is applied to the voltage-divider circuit 35 from the other ends of the fine metal wires 27a and 27b.

The voltage-divider circuit 35 divides the voltage Ein of the object 18 whose voltage is to be measured in accordance with a voltage-division ratio determined by the ratio of the resistances 36 and 38 of the voltage-divider circuit 35, then applies the thus-divided voltage Eout to the modulation-inducing electrodes 34a and 34b. Various different types of resistor could be used to configure this voltage-divider circuit 35 as necessary, such as coated resistors, chip resistors, or thin-film resistor formed by deposition of a resistor material, but chip resistors are used in this embodiment to ensure that the sensor section 21 is small. The voltage-division ratio of this voltage-divider circuit 35 can be set freely by using resistors of any suitable resistance. In this case, the voltage-dividing resistor 36 is set to be 1 mΩ and the voltage-dividing resistor 38 is set to be 9 mΩ.

Figure 3:
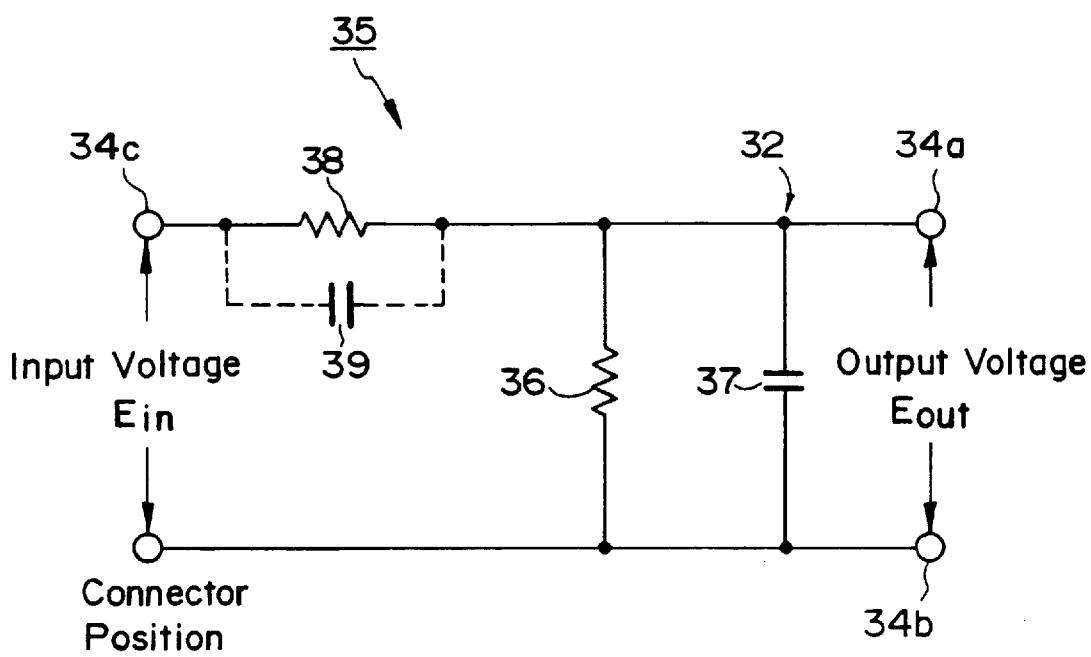
FIG. 3 shows the circuit configuration of a voltage-divider circuit in the optical integrated voltage sensor of this embodiment.

An equivalent circuit of the voltage-divider circuit 35 of this embodiment is shown in FIG. 3.

As shown in this figure, one voltage-dividing resistor 36 is connected between the electrodes 34a and 34b and the other voltage-dividing resistor 38 is connected between the electrodes 34a and 34c.

A capacitor 37 that forms the actual optical modulator is connected between the modulation-inducing electrodes 34a and 34b, in parallel with the voltage-dividing resistor 36. In other words, a strongly dielectric material such as LiNbO3 or LiTaO3, a semiconductor such as GaAlAs or Si, or a non-crystalline material such as SiO2 or Si3N4 can be used as the substance between the modulation-inducing electrodes 34a and 34b, that is, the material of the optical integrated circuit 32, but LiNbO3 which has an electro-optical effect is used in this embodiment. Therefore, that material itself forms the capacitor 37 between the modulation-inducing electrodes 34a and 34b. In this embodiment, the capacitance of this capacitor 37 is 2.5 pF.

In this manner, the voltage-divider circuit 35 of this embodiment comprises a parallel circuit of the resistor 36 and the capacitor 37. The impedance of this parallel circuit portion va varies with frequency, which means that the voltage-division ratio of the voltage-divider circuit 35 also varies with respect to frequency. In other words, the parallel circuit consisting of the voltage-dividing resistor 36 and the capacitor 37 can function as a low-pass filter that has a cut-off frequency determined by the voltage-dividing resistor 36 and the capacitor 37. This voltage-divider circuit 35 can be used in the optical integrated voltage sensor of this invention, but if a high-frequency voltage that exceeds the cut-off frequency is applied to the optical integrated voltage sensor of this invention, that voltage would be attenuated and accurate measurement of that voltage would become impossible.

To solve that problem and make it possible to measure the voltage of an object to be measured more accurately, even if it is a high-frequency voltage, the voltage-divider circuit 35 of this embodiment is also provided with a compensatory capacitor 39 that is connected in parallel with the voltage-dividing resistor 38. This compensatory capacitor 39 is attached in parallel with the resistor 38 with the objective of supplementing the capacitor 37.

This compensatory capacitor 39 could be a chip capacitor, or it could be formed by using means such as the electrodes 34a and 34c which have been placed facing one another at a certain spacing d, as shown in FIG. 1. If the latter method is used to form the compensatory capacitor 39, first of all the electrodes 34a and 34c are formed at the spacing d, then the capacitance of this compensatory capacitor can be set as desired by cutting the width of these electrodes. This ensures that, even if a large, high-frequency voltage is applied to the optical integrated voltage sensor of this invention for some reason, the voltage-divider circuit 35 divides this input voltage reliably, the optical integrated voltage sensor itself is protected from destruction, and furthermore this input voltage can be divided reliably without changing the frequency response.

The method used for setting the capacitance of the compensatory capacitor 39 will now be described. In this example, the description below assumes that this capacitance of the compensatory capacitor 39 is Cp, the resistance of the resistor connected parallel thereto is Rp, the capacitance of the capacitor 37 is C0, the resistance of the resistor connected parallel thereto is R0, the input voltage from a high-frequency power source is Ein, and the output voltage is Eout.

The input voltage Ein in this voltage-divider circuit 35 is given by the following equation:

$$Eout = \frac{\frac{Ro}{1 + j\omega RoCo}}{\frac{R_p}{1 + j\omega RpCp} + \frac{Ro}{1 + j\omega RoCo}} Ein$$

Where the following equation holds if Cp is adjusted so that RpCp=R0C0:

$$Eout = \frac{Ro}{Rp + Ro} Ein$$

It is clear from the above equations that the value of the input voltage Ein is no longer affected by frequency.

In the voltage-divider circuit 35 of this embodiment, R0=1 mΩ and C0=2.5 pF, and Rp is constructed to be 9 mΩ, so that Cp is approximately 0.278 pF.

It is therefore clear that the voltage-divider circuit 35 of this embodiment operates without being affected by frequency, even if the frequency of the input voltage Ein increases. In other words, this voltage-divider circuit 35 is effective even when a large high-frequency voltage is applied thereto, and is particularly effective as an optical integrated voltage sensor for use in the measurement of devices that use high-frequency voltages in applications such as the automobile electronics field.

The voltage signal Eout that is output from this voltage-divider circuit 35 is applied as voltages of opposite sign to the first and second modulation-inducing waveguides 15a and 15b within the modulation section, by the modulation-inducing electrodes 34a and 34b. If, for example, a positive potential is applied to the first modulation-inducing waveguide 15a of the modulation section and a negative potential is applied to the second modulation-inducing waveguide 15b thereof, the refractive indexes of these waveguides are changed.

Note that a reflective surface 40 is formed in the optical integrated circuit 32 at a position at the far end of the first and second modulation-inducing waveguides 15a and 15b, to reflect the measuring beams that are propagating within the waveguides and cause them to be propagated back in the reverse direction within the first and second modulation-inducing waveguides 15a and 15b. This ensures that the measuring beams propagating within the first and second modulation-inducing waveguides 15a and 15b pass once again through the optical intensity modulation section where they are again subjected to phase modulation, making the resultant phase difference substantially twice that before the reflection by the reflective surface 40. This reflective surface 40 could be formed as an accumulation of a metal such as Al or Au or of a thin film of a dielectric material formed by a method such as deposition or sputtering, on a polished end surface of the optical integrated circuit 32.

The measuring beams that have been reflected and are propagating back within the first and second modulation-inducing waveguides 15a and 15b are subjected to constructive interference by the wave branching/combining section 19, and the phase difference is modified to the intensity of the light at the wave branching/combining section 19. The measuring beam of a light intensity that has been modulated in this manner in accordance with the magnitude of the voltage is once again output toward the optical fiber 28 from the input end of the waveguide 17. It should be noted that the waveguide 17 is constructed in such a manner that the light waves are sealed in the interior thereof, by making the refractive index thereof greater than that of the surrounding material.

The modulated measuring beam propagating within the optical fiber 28 is then incident on the beam splitter 24 through the lens 26.

The measuring beam that is incident in this manner on the beam splitter 24 is once again divided into a direction passing through the beam splitter 24 and a reflected direction perpendicular thereto, and the part of the measuring beam that has been branched off in the reflected direction is input to the signal processing section 20.

The signal processing section 20 is configured to calculate the voltage of the object 18 whose voltage is to be measured on the basis of the intensity of the thus-input measuring beam. The signal processing section 20 of this embodiment consists of the light detector 12, which converts the measuring beam into an electrical signal, and an amplifier 14, which amplifies the converted electrical signal. A voltage signal that is output from the light detector 12 is input to the amplifier 14 where the intensity of the voltage signal is amplified.

The result of this amplification could be either output to a connector 30 or displayed directly on a display device, but the configuration of this embodiment is such that it is output to the connector so that it can be measured by an ordinary voltage-measuring device such as a voltmeter, an oscilloscope, or a spectrum analyzer.

This connector 30 could be, for example, a BNC connector or SMC connector, but a BNC connector is used in this embodiment.

The description now turns to the operation of the optical integrated voltage sensor of this invention.

When a measuring beam is output from the measuring beam generation section 22, it is divided into two parts by the beam splitter 24 and only the part of the measuring beam that has passed therethrough is incident through the lens 26 onto the optical fiber 28, which has a maintained plane of polarization.

The measuring beam that is incident on the optical fiber 28 in this manner propagates through the interior thereof, then, when it reaches the sensor section 21, it is incident into the waveguide 17 from an incident end thereof. The thus-incident measuring beam then propagates within the waveguide 17 until it reaches the optical intensity modulation section and is branched by the wave branching/combining section 19 and is propagated into the first and second modulation waveguides 15a and 15b. The branching ratio in this case is set to 50:50, for example.

While these measuring beams are propagating within the first and second modulation waveguides 15a and 15b, they are subjected to phase modulation in accordance with the magnitude of the voltage Eout that is applied to the modulation-inducing electrodes 34a and 34b. In other words, the voltage Ein of the object 18 whose voltage is to be measured is divided by the voltage-divider circuit 35 that is provided on the modulation-inducing electrodes 34a and 34b of the optical intensity modulation section, and the measuring beams are subjected to phase modulation in accordance with the magnitude of the voltage Ein applied to the modulation-inducing electrodes 34a and 34b.

During this time, voltages of opposite sign are applied to the first and second modulation waveguides 15a and 15b by the modulation-inducing electrodes 34a and 34b. Thus the measuring beam propagating within the first modulation waveguide 15a experiences a phase change of a sign that is opposite to that of the measuring beam propagating within the second modulation waveguide 15b, so that a phase difference is generated between the two.

While this phase modulation is occurring, the measuring beams propagating within the first and second modulation waveguides 15a and 15b are reflected by the reflective surface 40 formed on the surface at the other end of the optical integrated circuit 32, so that they are propagated back in the opposite direction within the first and second modulation waveguides 15a and 15b. These measuring beams then pass again through the optical intensity modulation section and are again subjected to phase modulation. The phase difference between the measuring beams proceeding in the opposite direction within these first and second modulation waveguides 15a and 15b is substantially twice that of the measuring beams immediately before they are reflected by the reflective surface 40.

This ensures that the sensor section 21 of this invention achieves a measurement sensitivity that is approximately twice that of a non-reflective type of sensor, for the same magnitude. Alternatively, if the sensor section 21 is designed to achieve the same measurement sensitivity, it can be reduced to substantially half the size.

The measuring beams that are propagating back in the opposite direction within the first and second modulation waveguides 15a and 15b are subjected to constructive interference in the wave branching/combining section 19, and this results in the phase difference modifying the intensity of the light.

In other words, if the voltage of the object 18 whose voltage is to be measured is zero, the phase difference is also zero and the luminous energy at that point is at a maximum. If a voltage of a certain value is then generated, the luminous energy becomes zero or a minimum value when the phase difference reaches 180°.

If a weaker voltage is to be measured, the phase difference could be pre-set to be 90° when the voltage is zero, by making the lengths of the first and second modulation waveguides 15a and 15b different and/or by making the refractive indexes thereof different. This makes it possible to achieve an increased intensity of the output light, with even a very weak voltage.

Therefore, the phase difference, and thus the voltage, can be measured by measuring the intensity of the luminous energy of the thus-modulated light.

In this manner, the modulated measuring beam that is output from the modulation section is made to be incident on the optical fiber 28 from the incident end of the waveguide 17, passes through the lens 26, and is then incident on the beam splitter 24. The measuring beam is then divided into two parts by the beam splitter 24, and only the light that has been branched within the beam splitter 24 is incident on the light detector 12.

This light detector 12 converts the thus-input modulated measuring beam into an electrical signal and outputs it towards the amplifier 14.

The amplifier 14 amplifies the intensity of the thus-input electrical signal and outputs the result of the amplification to the BNC connector 30.

As described above, the voltage sensor of this invention makes it possible to fabricate the sensor section 21 of basically non-metallic materials. This enables the measurement of voltages in a strong magnetic field, which is impossible in the prior art.

Furthermore, this aspect of the invention subjects the measuring beam guided into the optical integrated circuit 32 to twice the amount of phase modulation, by passing it twice through the optical intensity modulation section, so that the voltage detection sensitivity thereof is substantially doubled. This makes it possible to reduce the size of the sensor section 21 to approximately half that of a non-reflective type of optical integrated voltage sensor, for the same detection sensitivity.

This aspect of the invention enables both input and output of the measuring beam to be done through the optical integrated circuit 32 by a single optical fiber 28. This makes it possible to fabricate a cantilevered type of sensor section easily, without bending one of the two optical fibers provided for input and output in the prior art. Thus the sensor section 21 can be made more compact, without having to restrict the radius of curvature of the optical fiber, so that the dimensions thereof can be reduced to less than 1 mm if necessary, reducing the size of the sensor to one-tenth or less than that of a prior-art product. The use of the sensor section of this invention therefore enables measurement of voltages in cramped locations, which is impossible in the prior art.

With this invention, a single optical fiber 28 can be connected to the waveguide 17 of the optical integrated circuit 32. In other words, the connecting section between the optical fiber 28 and the waveguide is the component that necessitates the most precise adjustment, and it is also liable to cause changes in the characteristics because of long-term mechanical slippage. However, this invention reduces the number of such connecting section to half that of prior-art products, thus making it possible to fabricate an inexpensive sensor section that operates stably and highly accurately for a long time.

Since the voltage applied to the modulation-inducing electrodes 34a and 34b of the optical integrated circuit 32 in the optical integrated voltage sensor of this invention is applied thereto after being divided by the voltage-divider circuit 35, the sensor section 21 will not be destroyed, even if a high voltage is applied. This makes it possible to provide a sturdy sensor section 21 that is difficult to break, even if the optical integrated voltage sensor is handled carelessly. In other words, if the voltage of the object to be measured 18 greatly exceeds the dielectric breakdown voltage of the sensor section 21, there is no danger of dielectric breakdown because only a voltage that has been divided by the voltage-divider circuit 35 is applied to the modulation-inducing electrodes 34a and 34b.

In particular, the provision of the compensatory capacitor 39 of this embodiment ensures that, even if a voltage of a frequency that exceeds the cut-off frequency is applied to the sensor section 21, that voltage can be divided accurately without attenuation, making it possible to provide an optical integrated voltage sensor that is not affected by the frequency of the measurement voltage and is not likely to be damaged.

Thus the optical integrated voltage sensor of this invention solves the technological problems of the prior art, namely the difficulties involved in measuring voltages in electromagnetic fields and in cramped locations. It uses a compact, highly sensitive sensor section and enables favorable measurement of voltages even in the high-frequency bands, virtually unaffected by electromagnetic fields.

In the optical integrated voltage sensor of this invention, the optical fiber 28 need only be connected to one end surface 32a of the optical integrated circuit 32, as shown in FIG. 1, making it possible to use a structure called a cantilevered-bridge structure. This means that there is basically no need to provide another end surface 32b on the side of the optical integrated circuit 32 on which the reflective surface 40 is provided.

This optical integrated voltage sensor makes best use of these characteristics in a configuration that is easy to use. In other words, voltage-measurement terminals are provided on the end surface 32b on the side on which the reflective surface 40 is provided, as shown in FIG. 4. The provision of voltage-measurement terminals on the far end of the cantilevered-bridge sensor makes it possible to provide a sensor that is convenient to use, by facilitating the connection of these voltage-measurement terminals to the object to be measured.

Figure 4A:
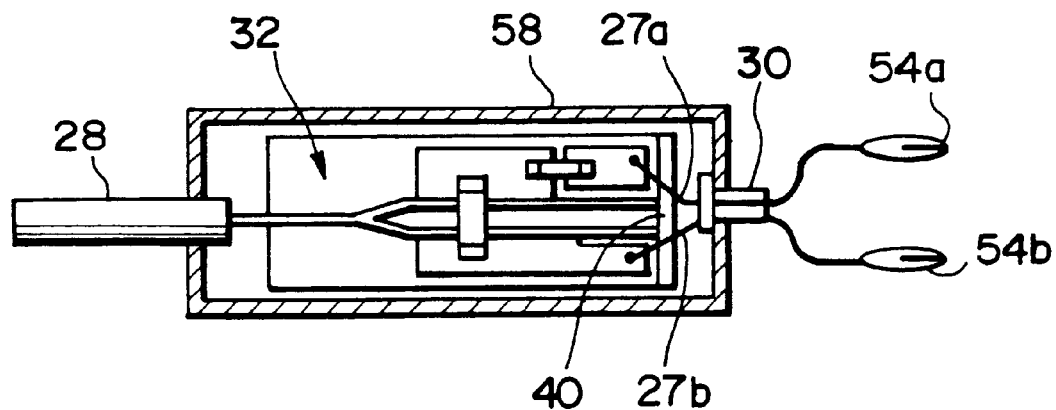
FIGS. 4A, 4B, and 4C show specific examples of voltage-measurement terminals that are provided for the optical integrated voltage sensor of this embodiment.
Figure 4B:
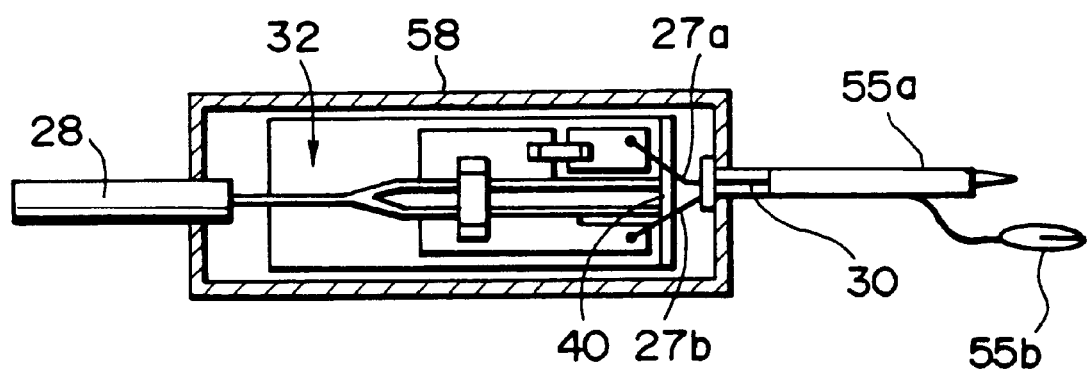
Figure 4C:
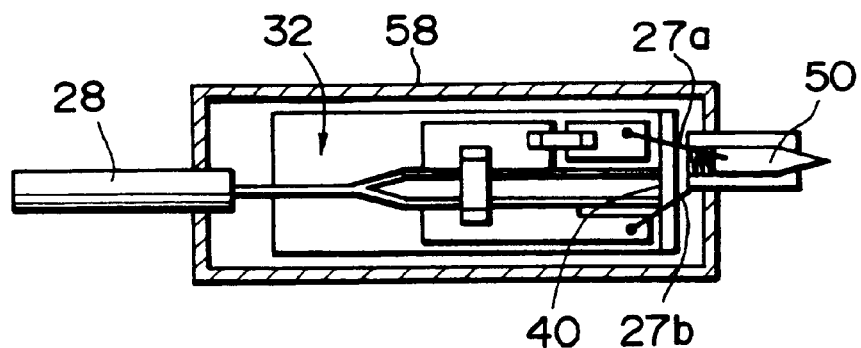

Three variations in the form of these voltage-measurement terminals are shown in FIGS. 4A, 4B, and 4C: crocodile clips, oscilloscope probes, and a contact probe.

For example, the optical integrated voltage sensor of this invention that is shown in FIG. 4C is configured in such a manner that a contact probe 50 is attached integrally to a case 58 and the contact probe 50 is connected to the modulation-inducing electrodes 34c and 34b of the optical integrated circuit 32, as shown in FIG. 1, through the wires 27a and 27b. This contact probe 50 is brought into contact with a preferred voltage measurement portion of an object to be measured, such as a pin of a transistor, to measure the voltage generated at that pin. The contact probe 50 of this embodiment has a coaxial configuration with a signal line portion in the center thereof with a ground line portion surrounding it. This contact probe 50 could either be connected directly to the modulation-inducing electrodes 34c and 34b or it could be connected by an electrically conductive adhesive.

In this case, the distance between the contact probe 50 and the optical integrated circuit 32 can be made extremely short, so that, even if the transistor is placed momentarily in a strong electromagnetic field, the sensor can accurately measure the voltage generated at that pin of the object to be measured, without being affected by the electromagnetic field.

If the object to be measured is assumed to be provided within the engine compartment of an automobile, for example, and if an attempt is make to use another voltage measuring device, such as an oscilloscope, to measure the voltage at a pin of this object to be measured, electromagnetic fields will generally appear too strong as noise in the signal, making accurate measurement of that voltage difficult.

In contrast thereto, the versions of the optical integrated voltage sensor of this invention shown in FIG. 4 can measure the pin voltage accurately. In other words, in the optical integrated voltage sensor of this aspect of the invention shown in FIG. 4C by way of example, the distance between the measurement terminal and the optical integrated circuit is extremely short, making it possible to use this sensor even in frequency bands or up to several hundred MHz. Thus voltages can be measured by the optical integrated voltage sensor shown in FIG. 4C in most electromagnetic field environments, irrespective of frequency.

Furthermore, this type of optical integrated voltage sensor is constructed to have a compact cantilevered structure. Therefore, when the voltage of an object is to be measured, the configuration shown in FIG. 4C in which the contact probe 50 is attached integrally to the far end surface of the optical integrated voltage sensor, as shown in FIG. 4C, ensures that measurement can be performed easily and effectively by simply placing the contact probe 50 into physical contact with the pin of the object to be measured.

Measurement leads such as those shown in FIG. 4A or a coaxial lead such as that shown in FIG. 4B could be provided instead of the above contact probe.

If the measurement leads are crocodile clips 54a and 54b that are connected by the connector 30, as shown in FIG. 4A by way of example, this sensor can measure voltages under frequencies of approximately several MHz.

Similarly, if the coaxial lead consists of oscilloscope probes 55a and 55b that are connected by the connector 30, as shown in FIG. 4B by way of example, this sensor can measure voltages under frequencies of approximately several tens of MHz.

The description now turns to experiments in which the voltage of a test object was measured, using the optical integrated voltage sensor of this invention. These experiments were performed using an experimental apparatus as shown in FIG. 5.

Figure 5A:
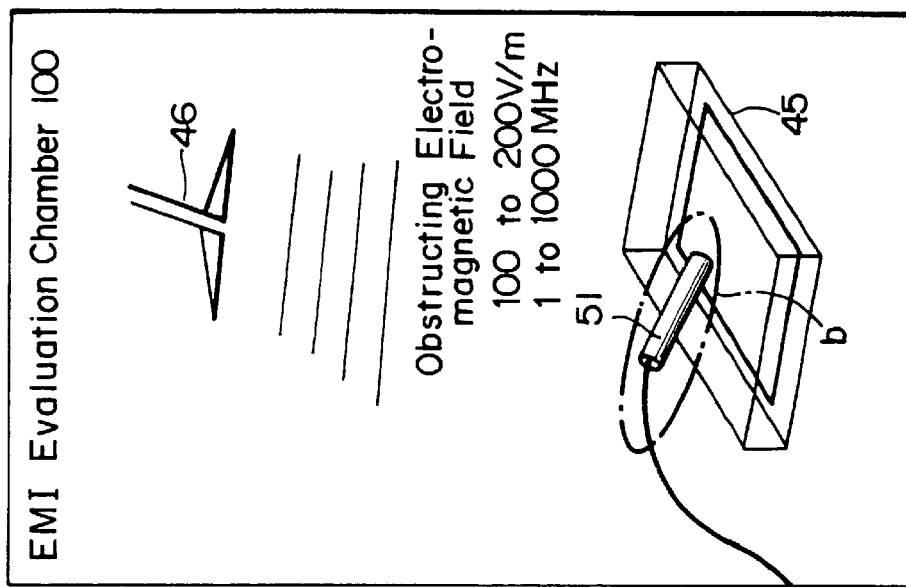
FIGS. 5A and 5B are explanatory drawings of an experimental apparatus wherein the optical integrated voltage sensor of this invention used a contact probe as a measurement terminal.
Figure 5B:
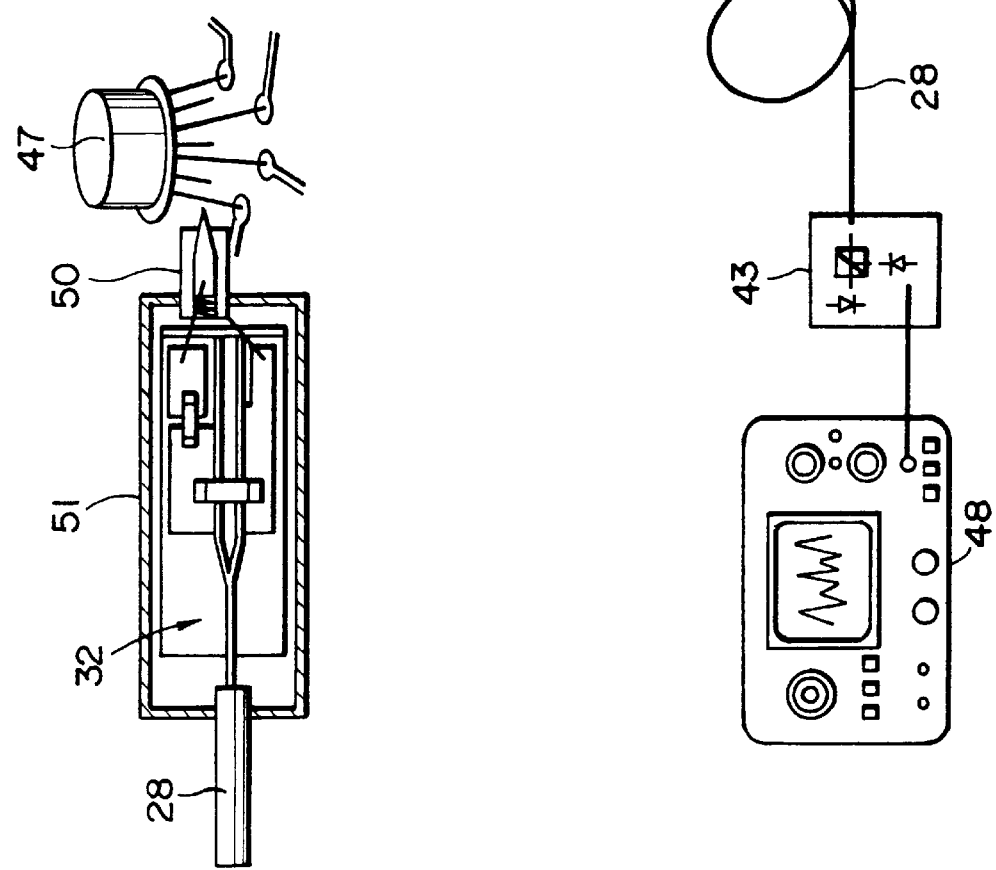

In this case, FIG. 5A shows a measuring apparatus that uses one of the optical integrated voltage sensors shown in FIG. 4. FIG. 5B is an enlargement of a transistor 47, which is the object to be measured, and an optical integrated voltage sensor. The type of optical integrated voltage sensor shown in FIG. 4C is used here by way of example in the description below.

For these experiments, an antenna 46 was placed within an EMI evaluation chamber 100, as shown in FIG. 5, and an environment was created in which obstructing electromagnetic fields of 100 to 200 V/m and 1 to 1000 MHz were generated. Electronic equipment 45 that was the object to be measured was placed in this environment that simulates obstructing electromagnetic fields, and the voltage generated at a pin of the transistor 47 of the electronic equipment was measured by an oscilloscope 48.

In these experiments, the optical integrated voltage sensor 51 of FIG. 4C was used and the contact probe 50 was connected to the pin of the transistor 47. This caused the voltage to be measured of the transistor 47 to be applied to the modulation-inducing electrodes 34c and 34b, modulating the measuring beam. The modulated measuring beam was input to a measuring beam input/output circuit 43 and the results of signal processing were displayed as an output waveform on the oscilloscope 48.

In these experimental examples, the optical fiber 28 of this optical integrated voltage sensor 51 was set to be 100 cm long and the contact probe 50 was set to be 3 cm. The obstructing electromagnetic field was set to 100 V/m and the voltage at the pin of the transistor 47, which was the object to be measured, was measured by the oscilloscope 48.

In comparative experiments, the voltage at the pin of the transistor 47 was measured by an ordinary measurement method using an oscilloscope, under the same measurement environment as that of the above experiments.

Figure 6:
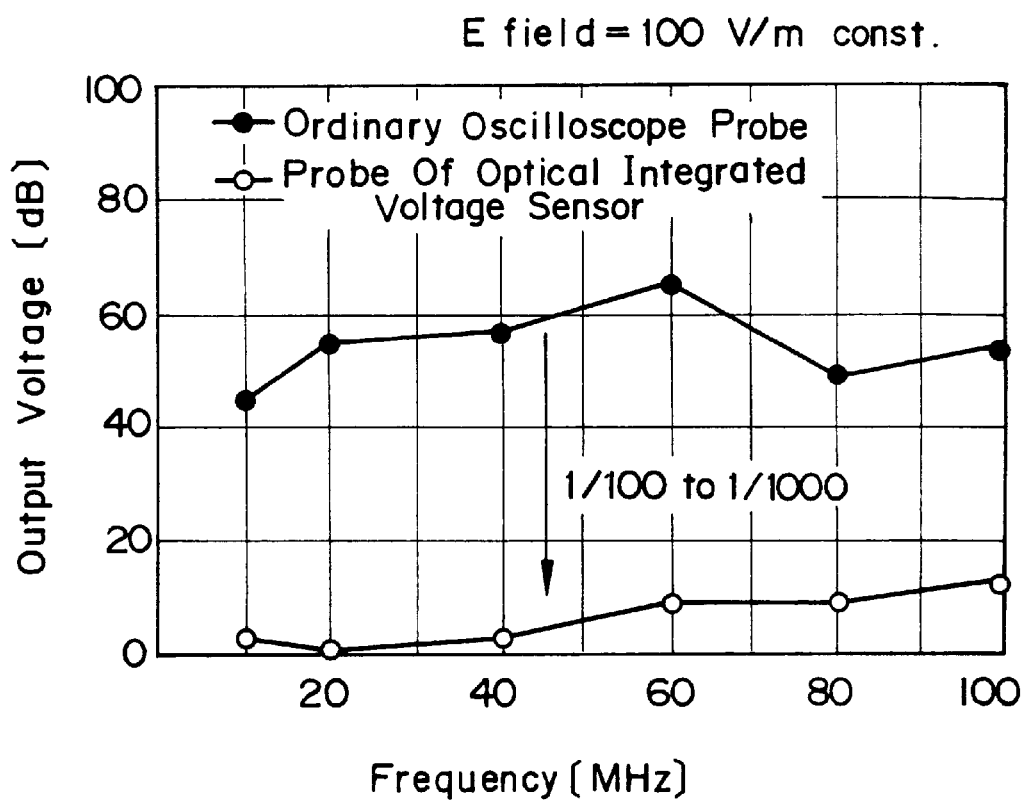
FIG. 6 is a graph of measurement data obtained by measurements using the optical integrated voltage sensor of this invention and measurements using a prior-art method.

The results of these measurements are shown in the graph of FIG. 6. In this figure, frequency (in MHz) is plotted along the horizontal axis and output voltage (in dB) is plotted along the vertical axis. In these experiments, the voltage of the pin of the transistor 47 was set to zero.

When the voltage at the pin of the transistor 47 was measured using the optical integrated voltage sensor 51 of FIG. 4C, that measurement voltage, in other words, the voltage of the pin of the transistor 47, was found to be substantially zero. In these experiments, the effects of the contact probe 50 of the optical integrated voltage sensor 51 ensured that the measurement voltage at the pin of the transistor 47 was close to substantially zero, regardless of the electromagnetic field intensity.

In contrast thereto, the comparative experimental results obtained by the prior-art device showed that the measurement voltage at the pin of the transistor 47 exceeded 40 dB, regardless of the electromagnetic field intensity, so that it could not be measured accurately. In other words, a large amount of noise was superimposed on the measured value, making it impossible to measure the voltage at that pin accurately.

These experimental results confirmed that measurements obtained by using the optical integrated voltage sensor 51 of this invention had a reduced level of output noise that was between $\frac{1}{100}$ to $\frac{1}{1000}$ that of the prior-art measurement method using an oscilloscope.

In this manner, these experimental results proved that the optical integrated voltage sensor of this invention operates without being affected by frequency, and that the admixture of noise into the output voltage is extremely small.

The above-described application of voltage-measurement terminals to the optical integrated voltage sensor of this invention makes it possible to accurately measure a voltage at a pin of an object to be measured that is place within a strong electromagnetic field.

What is claimed is:

1. An optical integrated voltage sensor comprising:

measuring beam generation means for outputting a measuring beam;

an optical fiber for guiding said measuring beam;

sensor means for modulating the intensity of said measuring beam in accordance with a measurement voltage and outputting said modulated measuring beam back towards said optical fiber;

branching means provided between said measuring beam generation means and said optical fiber, for passing said measuring beam from said measuring beam generation means and branching said measuring beam modulated by said sensor means into a given direction; and signal processing means for calculating said measurement voltage, based on the intensity of the measuring beam branched by said branching means;

wherein said sensor means comprises an optical integrated circuit, which comprises:

a waveguide formed at one end as a measuring beam incident section and at the other end as a measuring beam reflection section; and an optical intensity modulation section for modulating and outputting the intensity of said measuring beam propagating within said waveguide in accordance with said measurement voltage wherein said waveguide comprises a first modulation-inducing waveguide and a second modulation-inducing waveguide which are branched off at a wave branching/combining section;

said measuring beam reflection section is formed at the other end of each of said first and second modulation-inducing waveguides;

said optical intensity modulation section is provided with a pair of electrodes for applying oppositely polarized voltages to said first and second modulation-inducing waveguides, thereby modifying the phases of the measuring beams propagating within each of said modulation-inducing waveguides, and causing constructive interference between the modified measuring beams at said wave branching/combining section so as to output a measuring beam of an intensity that has been modified in accordance with said measurement voltage; and said optical intensity modulation section is provided with a voltage-divider circuit for dividing the voltage of a signal, and a voltage that corresponds to a voltage-division ratio thereof is applied to said electrodes.

2. The optical integrated voltage sensor as defined in claim 1, wherein said voltage-divider circuit comprises:

a first resistor provided between said electrodes;

a second resistor connected in series with said first resistor; and a first capacitor obtained from the structure of said optical integrated circuit, being connected in parallel with the ends of said first resistor; and wherein a signal voltage is applied to the series circuit of said first and second resistors and a divided voltage is output from said electrodes connected to said first resistor.

3. The optical integrated voltage sensor as defined in claim 2, wherein:

said voltage-divider circuit further comprises a second capacitor that is connected in parallel with said second resistor.

4. The optical integrated voltage sensor as defined in claim 3, wherein:

said second capacitor is set to have a capacitance that compensates for the frequency dependency of the voltage-divider circuit caused by said first capacitor.

5. The optical integrated voltage sensor as defined in claim 4, wherein:

the product of the capacitance of said first capacitor and the resistance of said first resistor is substantially equal to the product of the capacitance of said second capacitor and the resistance of said second resistor.

6. An optical integrated voltage sensor comprising:

measuring beam generation means for outputting a measuring beam;

an optical fiber for guiding said measuring beam;

sensor means for modulating the intensity of said measuring beam in accordance with a measurement voltage and outputting said modulated measuring beam back towards said optical fiber;

branching means provided between said measuring beam generation means and said optical fiber, for passing said measuring beam from said measuring beam generation means and branching said measuring beam modulated by said sensor means into a given direction; and signal processing means for calculating said measurement voltage, based on the intensity of the measuring beam branched by said branching means;

wherein said sensor means comprises an optical integrated circuit, which comprises:

a waveguide formed at one end as a measuring beam incident section and at the other end as a measuring beam reflection section; and an optical intensity modulation section for modulating and outputting the intensity of said measuring beam propagating within said waveguide in accordance with said measurement voltage a voltage-measurement terminal section which is provided on a far end surface side of said optical integrated circuit, for contacting a voltage measurement section of an object to be measured and supplying said measurement voltage to said electrodes.

7. The optical integrated voltage sensor as defined in claim 6, wherein:

said sensor means comprises a housing which fixes said optical fiber to one end side thereof and said terminal section to another end side thereof.

8. An optical integrated voltage sensor comprising:

measuring beam generation means for outputting a measuring beam;

an optical fiber for guiding said measuring beam;

sensor means for modulating the intensity of said measuring beam in accordance with a measurement voltage and outputting said modulated measuring beam back towards said optical fiber;

branching means provided between said measuring beam generation means and said optical fiber, for passing said measuring beam from said measuring beam generation means and branching said measuring beam modulated by said sensor means into a given direction; and signal processing means for calculating said measurement voltage, based on the intensity of the measuring beam branched by said branching means;

wherein said sensor means comprises an optical integrated circuit, which comprises:
- a waveguide formed at one end as a measuring beam incident section and at the other end as a measuring beam reflection section; and
- an optical intensity modulation section for modulating and outputting the intensity of said measuring beam propagating within said waveguide in accordance with said measurement voltage
- a voltage-measurement terminal section which is provided on a far end surface side of said optical integrated circuit, for contacting a voltage measurement section of an object to be measured and supplying said measurement voltage to said voltage-divider circuit;
- wherein said voltage-divider circuit divides a voltage from said terminal section and applies said divided voltage to said electrodes.

9. The optical integrated voltage sensor as defined in claim 8, wherein:
- said sensor means comprises a housing which fixes said optical fiber to one end side thereof and said terminal section to another end side thereof.

10. The optical integrated voltage sensor as defined in claim 9, wherein:
- said terminal section is fixed into said housing and comprises a contact probe in contact with a voltage measurement section of said object to be measured.

11. The optical integrated voltage sensor as defined in claim 9,
- wherein said terminal section comprises:
- a contact probe fixed to said housing and having an end that contacts a first voltage measurement section of said object to be measured; and
- gripper means for gripping a second voltage measurement section of said object to be measured, in such a manner as to maintain an electrical contact state; and
- wherein a voltage between said first and second voltage measurement sections of said object to be measured is supplied to said voltage-divider circuit.

12. The optical integrated voltage sensor as defined in claim 9,
- wherein said terminal section is fixed into said housing and comprises a contact probe in contact with a voltage measurement section of said object to be measured,
- thereby supplying voltage of said voltage measurement section against ground to said voltage-divider circuit.

13. The optical integrated voltage sensor as defined in claim 9,
- wherein said terminal section comprises:
- a first gripper means for gripping a first voltage measurement section of said object to be measured in such a manner as to maintain an electrical contact state; and
- a second gripper means for gripping a second voltage measurement section of said object to be measured in such a manner as to maintain an electrical contact state; and
- wherein a voltage between said first and second voltage measurement sections of said object to be measured is supplied to said voltage-divider circuit.

* * * * *